(12) United States Patent
Takamatsu et al.

(10) Patent No.: US 10,381,547 B2
(45) Date of Patent: Aug. 13, 2019

(54) DIELECTRIC FILM, METHOD FOR MANUFACTURING THE SAME, AND TRANSDUCER INCLUDING THE SAME

(71) Applicant: Sumitomo Riko Company Limited, Aichi (JP)

(72) Inventors: Shigeaki Takamatsu, Aichi-ken (JP); Shinji Kumagai, Aichi-ken (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 350 days.

(21) Appl. No.: 15/190,673

(22) Filed: Jun. 23, 2016

(65) Prior Publication Data

US 2016/0300997 A1    Oct. 13, 2016

Related U.S. Application Data (60) Division of application No. 13/934,888, filed on Jul. 3, 2013, which is a continuation of application No. PCT/JP2012/074018, filed on Sep. 20, 2012.

(30) Foreign Application Priority Data

Sep. 29, 2011   (JP) .................................. 2011-214151

(51) Int. Cl.
*H01L 41/193*   (2006.01)
*C08J 5/18*   (2006.01)
(Continued)

(52) U.S. Cl.
CPC ............ *H01L 41/193* (2013.01); *C08J 3/215* (2013.01); *C08J 5/18* (2013.01); *C08K 3/22* (2013.01);
(Continued)

(58) Field of Classification Search
CPC ..... H01L 41/37; H01L 41/193; H01L 41/183; C08J 3/215; C08J 5/15; C08J 2313/00; C08J 2315/00; C08K 3/22; C08K 5/0091
(Continued)

(56) References Cited

U.S. PATENT DOCUMENTS

| 5,478,632 A | 12/1995 | Kurz |
| 6,599,631 B2 | 7/2003 | Kambe et al. |

(Continued)

FOREIGN PATENT DOCUMENTS

| CN | 1839488 | 9/2006 |
| CN | 102405590 | 4/2012 |

(Continued)

OTHER PUBLICATIONS

Office Action issued in European Patent Office (EPO) Counterpart Patent Appl. No. 12835999.9, dated Oct. 14, 2016.
(Continued)

*Primary Examiner* — Brian K Talbot
(74) *Attorney, Agent, or Firm* — Greenblum & Bernstein, P.L.C.

(57) ABSTRACT

A dielectric film includes an elastomer, and metallic oxide particles having a particle diameter of 100 nm or less that are chemically bonded to the elastomer and are dispersed in the elastomer in a state of primary particles. A method for manufacturing the dielectric film includes: a chelating process of adding a chelating agent to an organometallic compound to produce a chelate compound of the organometallic compound; a sol manufacturing process of adding an organic solvent and water to the chelate compound to obtain a sol of metallic oxide particles produced by the hydrolytic reaction of the organometallic compound; a mixed solution preparing process of mixing the sol of the metallic oxide particles and a polymer solution containing a rubber poly-
(Continued)

mer having functional groups that optionally react with hydroxy groups; and a film forming process of applying the mixed solution onto a substrate, and curing the resultant coating film.

13 Claims, 5 Drawing Sheets (51) Int. Cl.
    *C08K 3/22*     (2006.01)
    *H02N 1/00*     (2006.01)
    *C08J 3/215*     (2006.01)
    *H01L 41/37*     (2013.01)
    *H01L 41/18*     (2006.01)
    *C09D 115/00*     (2006.01)
    *C08K 5/00*     (2006.01)

(52) U.S. Cl.
    CPC ........ *C09D 115/005* (2013.01); *H01L 41/183* (2013.01); *H01L 41/37* (2013.01); *H02N 1/002* (2013.01); *C08J 2313/00* (2013.01); *C08J 2315/00* (2013.01); *C08K 5/0091* (2013.01)

(58) Field of Classification Search
    USPC .......................................................... 427/58
    See application file for complete search history.

(56) References Cited

U.S. PATENT DOCUMENTS

| | | |
|---|---|---|
| 7,369,396 B2 | 5/2008 | Maliakal |
| 8,354,358 B2 | 1/2013 | Kayama et al. |
| 2004/0102557 A1 | 5/2004 | Nanni et al. |
| 2011/0190432 A1* | 8/2011 | Tanabe .................... C01B 33/12 524/403 |
| 2011/0300393 A1* | 12/2011 | Iio ............................ C08K 3/36 428/521 |

FOREIGN PATENT DOCUMENTS

| | | |
|---|---|---|
| JP | 2-290258 | 11/1990 |
| JP | 2000-289134 | 10/2000 |
| JP | 2003-506858 | 2/2003 |
| JP | 2004-522620 | 7/2004 |
| JP | 2006-265094 | 10/2006 |
| JP | 2008-69326 | 3/2008 |
| JP | 2009173691   * | 3/2009 |
| JP | 2009-173691 | 8/2009 |
| JP | 2010-54296 | 3/2010 |
| JP | 2011-084712 | 4/2011 |
| WO | 01/06579 | 1/2001 |
| WO | 02/062594 | 8/2002 |
| WO | 2005/083809 | 9/2005 |
| WO | 2006/087986 | 8/2006 |
| WO | 2011/033956 | 3/2011 |

OTHER PUBLICATIONS

International Preliminary Report on Patentability and English language translation for PCT/JP2012/074018, dated Apr. 1, 2014.
Japan Office action, dated Mar. 3, 2015 along with an English translation thereof.
Office Action issued in China Counterpart Patent Appl. No. 201280018812.8, dated Jun. 3, 2015 , along with an English translation thereof.
International Search Report, dated Dec. 25, 2013.

* cited by examiner

FIG.1(a)

VOLTAGE OFF

FIG. 1(b)

VOLTAGE ON

Content of TiO₂ particles [parts by mass]

【FIG. 4】

Modulus of elasticity [MPa]

DIELECTRIC FILM, METHOD FOR MANUFACTURING THE SAME, AND TRANSDUCER INCLUDING THE SAME

CROSS-REFERENCE TO RELATED APPLICATION

This is a divisional application of U.S. patent application Ser. No. 13/934,888, filed Jul. 3, 2013, which is a continuation of PCT/JP2012/074018 filed Sep. 20, 2012, and claims priority of Japanese Application 2011-214151, filed on Sep. 29, 2011. The disclosures of these documents, including the specifications, drawings and claims, are incorporated herein by reference in their entirety.

TECHNICAL FIELD

The present invention relates to a dielectric film for use in a transducer such as an actuator and a speaker and a method for manufacturing the same. The present invention also relates to a transducer including the dielectric film.

BACKGROUND ART

Transducers are known that perform conversion between mechanical energy and electric energy such as actuators and sensors and that perform conversion between acoustic energy and electric energy such as speakers and microphones. In order to form a highly flexible, compact, and lightweight transducer, polymer materials such as dielectric elastomers are useful.

For example, as disclosed in Patent Document 1, an actuator can be formed by arranging a pair of electrodes on both sides in the thickness direction of a dielectric film formed of a dielectric elastomer. In actuators of this kind, when a voltage applied between the electrodes increases, an electrostatic attraction between the electrodes increases. The dielectric film interposed between the electrodes is thereby compressed in the thickness direction, leading to a reduced thickness of the dielectric film. When the film thickness decreases, the dielectric film accordingly expands in a direction parallel to the electrode surfaces. On the other hand, when the voltage applied between the electrodes is reduced, the electrostatic attraction between the electrodes decreases. A compressive force against the dielectric film in the thickness direction thereby decreases, and the film thickness increases due to the elastic restoring force of the dielectric film. When the film thickness increases, the dielectric film accordingly contracts in a direction parallel to the electrode surfaces. The actuator thus expands and contracts the dielectric film, thereby driving a member to be driven.

In order to increase a force and displacement output from the actuator by applying a high voltage, it is desirable that the volume resistivity of the dielectric film is high and that the resistance to dielectric breakdown thereof is high. As an elastomer material having high resistance to dielectric breakdown, silicone rubber is known.

RELATED ART DOCUMENTS

Patent Documents

Patent Document 1: Publication of Japanese Translation of PCT Application No. 2003-506858
Patent Document 2: Japanese Patent Application Publication No. 2011-084712
Patent Document 3: Japanese Patent Application Publication No. 2008-69326
Patent Document 4: Japanese Patent Application Publication No. 2006-265094

SUMMARY OF THE INVENTION

Problem to be Solved by the Invention

Because silicone rubber includes siloxane bonds as a backbone, its electric resistance is high. In a dielectric film formed of silicone rubber, therefore, dielectric breakdown is less likely to occur even when a large voltage is applied. However, the polarity of silicone rubber is low. In other words, the dielectric constant of the silicone rubber is small. Thus, when an actuator is formed employing a dielectric film formed of silicone rubber, an electrostatic attraction with respect to an applied voltage is small. It is therefore impossible to obtain a desired force and displacement using a practical voltage.

The inventors of the present invention have developed an elastomer material in which an inorganic filler such as silica is blended into an elastomer cross-linked by an organometallic compound (see Patent Document 2). In the elastomer material, the flow of electrons is interrupted by silica particles. Therefore, the electric resistance increases. However, the silica particles are not directly chemically bonded to the elastomer. For this reason, there is a risk of degradation in resistance to dielectric breakdown caused by the occurrence of discharge in minute interstices between the silica particles and the elastomer during voltage application. Furthermore, because the silica particles are prone to agglomerate, it is not easy to disperse the silica particles in the elastomer uniformly. For example, when particles having a large particle diameter such as agglomerated particles are present in the dielectric film, elongation at the time of expansion is likely to become uneven. In this case, defects are likely to occur with the particles serving as starting points, which may degrade resistance to dielectric breakdown.

The present invention has been achieved in view of the above circumstances, and an object thereof is to provide a dielectric film having high resistance to dielectric breakdown and a method for manufacturing the dielectric film. Another object thereof is to provide a transducer that has high resistance to dielectric breakdown and is excellent in durability.

Means for Solving the Problem (I) A dielectric film according to the present invention is a dielectric film for use in a transducer and is characterized by including an elastomer and metallic oxide particles having a particle diameter of 100 nm or less that are chemically bonded to the elastomer and are dispersed in the elastomer in a state of primary particles.

In the dielectric film according to the present invention, the flow of electrons is interrupted by the metallic oxide particles dispersed in the elastomer. Therefore, the electric resistance of the dielectric film according to the present invention is high. The metallic oxide particles are chemically bonded to the elastomer. Thus, there are no interstices between the metallic oxide particles and the elastomer. During voltage application, therefore, dielectric breakdown due to discharge is unlikely to occur. Further, because being immobilized to the elastomer, the metallic oxide particles are less prone to agglomerate. In other words, the metallic oxide particles are dispersed in the elastomer uniformly in a state of isolated primary particles, not in a state of agglomerated secondary particles. Furthermore, the metallic oxide particles are fine particles whose particle diameter is 100 nm or less. Thus, the film quality of the dielectric film becomes uniform. Elongation at the time of expansion therefore becomes uniform, so that defects starting from the metallic oxide particles are less likely to occur.

Metallic oxide nano particles are thus chemically bonded to the elastomer and are dispersed in the elastomer uniformly, so the resistance to dielectric breakdown of the dielectric film can be significantly improved. Therefore, a higher voltage can be applied to the dielectric film according to the present invention. As a result, with a transducer including the dielectric film according to the present invention, a larger force and displacement can be obtained.

The electric resistance of the dielectric film according to the present invention is high. Therefore, a current does not easily pass through the dielectric film when a voltage in a practical range is applied. This allows a large number of electric charges to be accumulated within the dielectric film, thereby generating a large electrostatic attraction to increase the output force and displacement. In addition, because a current does not easily pass through the dielectric film, generation of Joule's heat is suppressed. The dielectric film according to the present invention is therefore less likely to be broken by heat.

(2) A method for manufacturing a dielectric film according to the present invention for manufacturing the above dielectric film according to the present invention is characterized by including: a chelating process of adding a chelating agent to an organometallic compound to produce a chelate compound of the organometallic compound; a sol manufacturing process of adding an organic solvent and water to the chelate compound to obtain a sol of metallic oxide particles produced by the hydrolytic reaction of the organometallic compound; a mixed solution preparing process of mixing the sol of the metallic oxide particles and a polymer solution containing a rubber polymer having functional groups that can react with hydroxy groups to prepare a mixed solution; and a film forming process of applying the mixed solution onto a substrate, and curing the resultant coating film to obtain a dielectric film.

In the manufacturing method according to the present invention, the mixed solution in which the sol of the metallic oxide particles and the polymer solution containing the rubber polymer are mixed is formed into a film to manufacture the dielectric film according to the present invention. In the chelating process, an organometallic compound as a raw material is chelated using a chelating agent. The organometallic compound is hydrolyzed by reaction with water and undergoes a polycondensation (a sol-gel reaction). By chelating the organometallic compound in advance, a rapid reaction of the organometallic and water is suppressed in the next process, thereby allowing metallic oxide particles having a small particle diameter to be manufactured without being agglomerated. Subsequently, in the sol manufacturing process, an organic solvent and water are added to the chelate compound of the organometallic compound to progress a hydrolytic reaction. The metallic oxide particles are thereby produced. As will be described in detail later, the particle diameter of the metallic oxide particles can be adjusted by the composition of the organic solvent. In the following mixed solution preparing process, the sol of the metallic oxide particles manufactured in the previous process and the polymer solution containing the rubber polymer are mixed to prepare a mixed solution. The metallic oxide particles in the sol have hydroxy groups (—OH). On the other hand, the rubber polymer has the functional groups that can react with the hydroxy groups. In the following film forming process, therefore, a coating film formed from the mixed solution is cured, and the functional groups react with the hydroxy groups to allow the metallic oxide particles and the rubber polymer to be chemically bonded to each other. The metallic oxide particles are thereby dispersed in the cured rubber polymer (elastomer) uniformly. Thus, with the manufacturing method according to the present invention, the dielectric film according to the present invention can be easily manufactured.

(3) A transducer according to the present invention is characterized by including the dielectric film according to the present invention and a plurality of electrodes that are arranged via the dielectric film.

The transducer according to the present invention includes the dielectric film according to the present invention. As described above, the resistance to dielectric breakdown of the dielectric film according to the present invention is high. Because a current does not easily pass through the dielectric film within a practical voltage range, a large number of electric charges are accumulated in the dielectric film. A large electrostatic attraction is thereby generated. Therefore, with the transducer according to the present invention, a larger force and displacement can be obtained. In addition, the dielectric film according to the present invention is less likely to be broken by heat. Thus, the transducer according to the present invention is excellent in durability.

BRIEF DESCRIPTION OF THE DRAWINGS

FIGS. 1(a) and 1(b) show schematic sectional views of an actuator of an embodiment of a transducer according to the present invention: FIG. 1(a) illustrates a voltage OFF state; FIG. 1(b) illustrates a voltage ON state.

DESCRIPTION OF THE REFERENCE NUMERALS

1: Actuator (Transducer), 10: Dielectric film, 11a, 11b: Electrode, 12a, 12b: Electric wire, 13: Power source.

5: Actuator, 50: Dielectric film, 51a, 51b: Electrode, 52: Upper chuck, 53: Lower chuck.

MODES FOR CARRYING OUT THE INVENTION

Embodiments of a dielectric film, a method for manufacturing the same, and a transducer according to the present invention will be described. The dielectric film, the method for manufacturing the same, and the transducer according to the present invention are not limited to the embodiments below and may be embodied in various ways in which modifications, improvements, etc. that could be made by those skilled in the art are made without departing from the scope of the present invention.

<Dielectric Film>

A dielectric film according to the present invention includes an elastomer and metallic oxide particles having a particle diameter of 100 nm or less that are chemically bonded to the elastomer and are dispersed in the elastomer in a state of primary particles.

[Elastomer]

The elastomer is not particularly limited as long as it can be chemically bonded to the metallic oxide particles. In view of increasing an electrostatic attraction generated during voltage application, the elastomer is preferably high in polarity, that is, high in dielectric constant. For example, the elastomer preferably has a dielectric constant of 2.8 or more (a measuring frequency of 100 Hz). Examples of the elastomer having a high dielectric constant include nitrile rubber (NBR), hydrogenated nitrile rubber (H—NBR), acrylic rubber, urethane rubber, fluorocarbon rubber, fluorosilicone rubber, chlorosulfonated polyethylene rubber, chloroprene rubber, ethylene-vinyl acetate copolymer, and chlorinated polyethylene. As the elastomer, these may be used singly or as a mixture of two or more thereof.

As will be described later in the manufacturing method, the dielectric film according to the present invention is manufactured using a rubber polymer having functional groups that can react with hydroxy groups of the metallic oxide particles. Examples of the functional groups that can react with hydroxy groups include a carboxy group (—COOH), an amino group (—NH), and an epoxy group. Therefore, any elastomer modified by, for example, introducing functional groups into the elastomer may be used. Preferable examples include carboxy group-modified nitrile rubber (X—NBR) and carboxy group-modified hydrogenated nitrile rubber (XH—NBR). X—NBR and XH—NBR preferably have an acrylonitrile content (combined AN amount) of 33% by mass or more. The combined AN amount is the mass ratio of acrylonitrile with the entire rubber mass being 100% by mass.

[Metallic Oxide Particles]

The metallic oxide particles are chemically bonded to the elastomer by the reaction between their own hydroxy groups and the functional groups of the elastomer. The metallic oxide particles, in view of high insulating properties, preferably contain one or more elements selected from titanium, zirconium, and silicon. Examples of the metallic oxide particles include oxide particles of titanium dioxide ($TiO_2$), zirconium dioxide ($ZrO_2$), silica ($SiO_2$), and the like each in isolation, and complex particles thereof ($TiO_2/ZrO_2$, $TiO_2/SiO_2$, or the like). The metallic oxide particles may be contained singly or in combination of two or more thereof.

The particle diameter of the metallic oxide particles is 100 nm or less. In view of the dispersiblity and uniformity of the dielectric film in the elastomer, the metallic oxide particles desirably have a smaller particle diameter. For example, it is preferable that the median diameter of the metallic oxide particles is 10 nm or more and 50 nm or less. It is more preferable that the median diameter is 30 nm or less, and furthermore, 20 nm or less. The particle diameter of the metallic oxide particles can be measured through observation using a transmission electron microscope (TEM). It may also be measured by the small-angle X-ray scattering method.

As will be described later in the manufacturing method, the metallic oxide particles are synthesized by the hydrolytic reaction of an organometallic compound (the sol-gel process). In this case, it is estimated that the particle diameter of the metallic oxide particles in a sol and the particle diameter of the metallic oxide particles in the dielectric film become equal. The particle diameter of the metallic oxide particles in the sol may be therefore employed as the particle diameter of the metallic oxide particles in the dielectric film. The particle diameter of the metallic oxide particles in the sol can be measured by using, for example, a laser diffraction/scattering particle diameter/particle size distribution measuring apparatus manufactured by Nikkiso Co., Ltd. Also, when the sol is dried, the particle diameter of the metallic oxide particles can be measured through observation using a scanning electron microscope (SEM).

The content of the metallic oxide particles may be appropriately determined in view of the volume resistivity and flexibility of the dielectric film. For example, the content of the metallic oxide particles may be 1 part by mass or more and 20 parts by mass or less with respect to 100 parts by mass of the elastomer. This is because when the content of the metallic oxide particles is less than 1 part by mass, the effect of increasing electric resistance is poor. In contrast, when the content of the metallic oxide particles exceeds 20 parts by mass, the effect of increasing electric resistance is saturated, and only the modulus of elasticity increases.

[Other Components]

The dielectric film according to the present invention may contain other components in addition to the elastomer and the metallic oxide particles. Examples of the other components include cross-linking agents, reinforcing agents, plasticizers, antioxidants, and colorants, and in addition, inorganic fillers having high insulating properties. Blending an insulating material can further increase the electric resistance of the dielectric film. Examples of the inorganic filler include silica, titanium oxide, barium titanate, calcium carbonate, clay, calcined clay, and talc. These may be blended singly or as a mixture of two or more thereof. For example, silica is preferable for the reason that it has a large number of functional groups, which will be described later, and it is relatively inexpensive. Silica, titanium oxide, and barium titanate that are manufactured by the hydrolytic reaction of an organometallic compound (the sol-gel process) may be used.

In order to interrupt the flow of electrons to increase insulating properties, the elastomer and the inorganic filler are preferably chemically bonded to each other. In this case, an inorganic filler having functional groups that can react with the elastomer may be used. Examples of the functional groups include a hydroxy group (—OH), a carboxy group (—COOH), and a maleic anhydride group. The blend ratio of the inorganic filler may be determined with consideration given to the volume resistivity or the like of the dielectric film. For example, it is preferably 5 parts by mass or more and 50 parts by mass or less with respect to 100 parts by mass of the elastomer. Being less than 5 parts by mass is ineffective in increasing electric resistance. In contrast, exceeding 50 parts by mass may harden the dielectric film, which may impair flexibility.

The dielectric film according to the present invention is manufactured from a liquid composition containing metallic oxide particles that are synthesized by the hydrolytic reaction of an organometallic compound and have hydroxy groups and a polymer solution containing a rubber polymer having functional groups that can react with the hydroxy groups of the metallic oxide particles. Hereinafter, a method for manufacturing a dielectric film according to the present invention will be described.

<Method for Manufacturing Dielectric Film>

The method for manufacturing a dielectric film according to the present invention includes the chelating process, the sol manufacturing process, the mixed solution preparing process, and the film forming process. Hereinafter, each process will be described in order.

[Chelating Process]

The present process is a process in which the chelating agent is added to the organometallic compound to produce the chelate compound of the organometallic compound. When manufacturing a sol of complex particles such as $TiO_2/ZrO_2$ and $TiO_2/SiO_2$, an organometallic compound as the raw material of one metallic oxide compound constituting the complex particles is chelated in the present process, and in the following sol manufacturing process, an organometallic compound as the raw material of the other metallic oxide compounds may be added to the chelate compound.

The organometallic compound may be appropriately selected from metal alkoxide compounds and metal acylate compounds depending on the type of desired metallic oxide particles. Examples of the metal alkoxide compound include tetra-n-butoxy titanium, tetra-n-butoxy zirconium, tetra-n-butoxy silane, tetra-i-propoxy titanium, tetraethoxysilane, tetrakis (2-ethylhexyloxy) titanium, and titanium butoxide dimer. Examples of the metal acylate compound include polyhydroxy titanium stearate and zirconium tributoxy monostearate.

Examples of a chelating agent include β-diketone such as acetylacetone, benzoyl acetone, and dibenzoylmethane, β-keto acid ester such as ethyl acetoacetate and ethyl benzoylacetate, triethanolamine, lactic acid, 2-ethylhexane-1,3-diol, and 1,3-hexanediol. The chelating agent is preferably the same as a solvent for dissolving a rubber polymer in the mixed solution preparing process.

[Sol Manufacturing Process]

The present process is a process in which an organic solvent and water are added to the produced chelate compound to obtain a sol of metallic oxide particles produced by the hydrolytic reaction of the organometallic compound. In the present process, the hydrolytic reaction of the organometallic compound proceeds to produce the metallic oxide particles.

For the organic solvent, alcohols such as methanol, ethanol, and isopropyl alcohol (IPA), ketones such as methyl ethyl ketone (MEK) and methyl isobutyl ketone (MIBK), and ethers such as tetrahydrofuran (THF) may be used. For example, addition of IPA improves the affinity between the chelate compound and water, so that nuclei of metallic oxide particles are more likely to be produced. Addition of MEK can improve the compatibility between the sol containing metallic oxide particles and a polymer solution in the mixed solution preparing process. Depending on the type and additive amount of an organic solvent used, the particle diameter of the metallic oxide particles to be produced varies. For example, when metallic oxide particles having a median diameter of about 10 nm to 50 nm are produced, IPA and MEK may be added with the number of moles of IPA/the number of moles of MEK being about 0.6, and the additive amount of IPA may be seven to ten times the number of moles of the used organometallic compound. Water may be added in an amount required for the hydrolysis of the organometallic compound.

The obtained sol may be used for the next process as it is, or may be used for the next process after being subjected to aging treatment or microwave treatment. The aging treatment or microwave treatment can deactivate excessive hydroxy groups in the metallic oxide particles. This reduces reinforcing properties, thereby allowing a flexible dielectric film to be provided and the agglomeration of the metallic oxide particles in the sol under storage to be suppressed. For example, the aging treatment may be performed by leaving the sol at rest for a few hours under a temperature of about 40° C.

[Mixed Solution Preparing Process]

The present process is a process in which the manufactured sol of the metallic oxide particles and a polymer solution containing a rubber polymer having functional groups that can react with hydroxy groups are mixed to prepare a mixed solution.

The polymer solution is prepared by dissolving a predetermined rubber polymer in a solvent. As described above, the solvent used is preferably the same as the chelating agent used for chelating the organometallic compound. The blend amount of the sol may be appropriately determined in accordance with the amount of the metallic oxide particles to be contained in the elastomer. The mixed solution may be blended with other components such as a cross-linking agent and an inorganic filler as needed. In this case, the other components may be blended into the polymer solution in advance. The cross-linking agent is preferably an organometallic compound. Reactive residues of the cross-linking agent can be one of causes of decreasing the resistance to dielectric breakdown of the dielectric film. With the use of an organometallic compound, reactive residues are less likely to be left. Therefore, it is possible to suppress degradation in the resistance to dielectric breakdown of the dielectric film.

[Film Forming Process]

The present process is a process in which the prepared mixed solution is applied onto a substrate, and the resultant coating film is cured to obtain a dielectric film. A method for applying the mixed solution is not particularly limited. Examples of the method include printing methods such as inkjet printing, flexographic printing, gravure printing, screen printing, pad printing, and lithography, the dip method, the spray method, and the bar-coating method. The curing temperature of the coating film may be appropriately determined by taking into account the type of the solvent used and a reaction rate. For example, it is preferably set to the boiling point of the solvent or above.

<Transducer>

The transducer according to the present invention includes the dielectric film according to the present invention and a plurality of electrodes that are arranged via the dielectric film. The configuration of and method for manufacturing the dielectric film according to the present invention are as described above, so the description thereof will be omitted here. In the transducer according to the present invention, a preferable embodiment of the dielectric film according to the present invention is preferably employed.

The thickness of the dielectric film may be appropriately determined depending on its use or the like. For example, when the transducer according to the present invention is used as an actuator, the thickness of the dielectric film is preferably small in view of the size reduction and lower-potential drive of the actuator, increase in the displacement thereof, and the like. In this case, also taking into account the resistance to dielectric breakdown or the like, the thickness of the dielectric film is preferably 1 μm or more and 1000 μm (1 mm) or less. The more preferable range is 5 μm or more and 200 μm or less.

In the transducer according to the present invention, the material of the electrodes is not particularly limited. The electrodes are preferably expandable and contractible in accordance with the deformation of the dielectric film. In this case, the deformation of the dielectric film is hard to be restricted by the electrodes. Therefore, desired output is likely to be obtained in the transducer according to the present invention. For example, the electrodes can be formed from a conductive paste or a conductive coating in which a conductive material is mixed into a binder such as oil and an elastomer. Examples of the conductive material include carbon material such as carbon black, ketjen black, a carbon nanotube, and graphene, and metallic powder of silver or the like. The electrodes may also be formed by knitting carbon fibers or metallic fibers in mesh.

When the transducer according to the present invention is formed in a stacked structure in which a plurality of dielectric films and electrodes are alternately stacked, a larger force can be generated. When the stacked structure is employed, therefore, for example, the output of an actuator can be increased. A member to be driven can be thereby driven by a larger force.

Figure 1A:
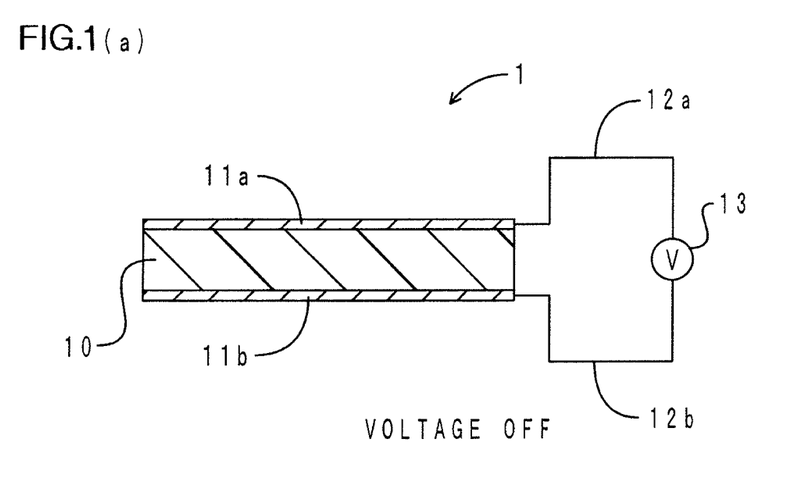
Figure 1B:
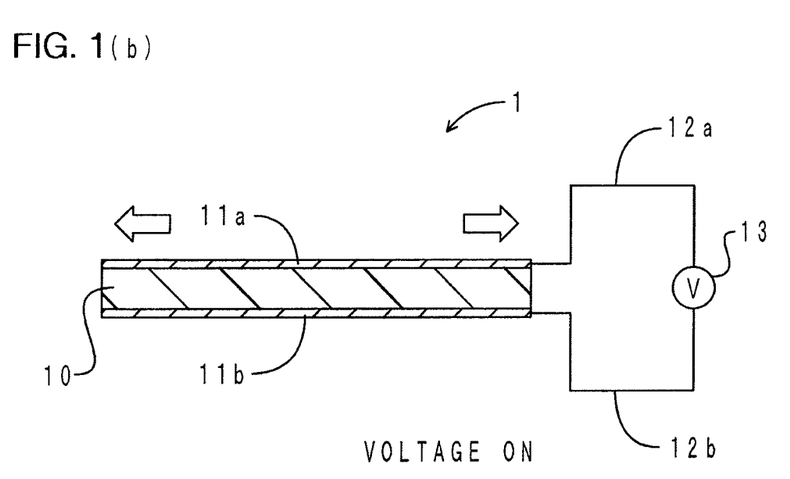

Hereinafter, an embodiment in which the transducer according to the present invention is embodied as an actuator will be described. FIG. 1 illustrates schematic sectional views of the actuator according to the present embodiment: (a) and (b) illustrate a voltage OFF state and a voltage ON state, respectively.

As illustrated in FIG. 1, this actuator 1 includes a dielectric film 10, electrodes 11a, 11b, and electric wires 12a, 12b. The dielectric film 10 contains carboxy group-modified hydrogenated nitrile rubber (HX—NBR) and titanium dioxide ($TiO_2$) particles. The particle diameter of the $TiO_2$ particles is 100 nm or less, and the median diameter thereof is 14 nm. The $TiO_2$ particles are chemically bonded to HX—NBR and are dispersed in HX—NBR in a state of primary particles. The electrode 11a is arranged so as to cover nearly the entire upper surface of the dielectric film 10. Similarly, the electrode 11b is arranged so as to cover nearly the entire lower surface of the dielectric film 10. The electrodes 11a, 11b are connected to a power source 13 through the electric wires 12a, 12b, respectively.

When the OFF state is switched to the ON state, a voltage is applied between the pair of electrodes 11a, 11b. Through the application of voltage, the thickness of the dielectric film 10 decreases and the dielectric film 10 expands accordingly in a direction parallel to the surfaces of the electrodes 11a, 11b as illustrated by the white arrow in FIG. 1(b). The actuator 1 thereby outputs driving forces in the up and down direction and right and left direction in the figure.

In the present embodiment, the flow of electrons in the dielectric film 10 is interrupted by the $TiO_2$ particles dispersed in HX—NBR. Therefore, the electric resistance of the dielectric film 10 is high. The $TiO_2$ particles are chemically bonded to HX—NBR. Thus, there are no interstices between the $TiO_2$ particles and HX—NBR. During voltage application, therefore, dielectric breakdown due to discharge is less likely to occur. Further, the $TiO_2$ particles are dispersed in HX—NBR in a state of primary particles. Thus, the film quality of the dielectric film 10 is uniform. In the dielectric film 10, therefore, elongation at the time of expansion becomes uniform, and defects with the $TiO_2$ particles as starting points are less likely to occur.

As described above, the dielectric film 10 has high resistance to dielectric breakdown. Therefore, a higher voltage can be applied to the dielectric film 10. In addition, the electric resistance of the dielectric film 10 is high. That is, a current does not easily pass through the dielectric film 10 when a voltage within a practical range is applied. The dielectric film 10 can therefore accumulate a large number of electric charges, thereby generating a large electrostatic attraction. Thus, with the actuator 1, a large force and displacement can be obtained. Because a current does not easily pass through the dielectric film 10, Joule's heat is less prone to be generated. The dielectric film 10 is therefore less likely to be broken by heat. The actuator 1 is therefore excellent in durability.

EXAMPLES

Subsequently, the present invention will be described more specifically with reference to the examples.

<Manufacture of Sol>

[$TiO_2$ Sol]

0.02 mol of acetylacetone was added to 0.01 mol of tetra-i-propoxy titanium as an organometallic compound to be chelated. Next, 0.083 mol of isopropyl alcohol (IPA), 0.139 mol of methyl ethyl ketone (MEK), and 0.04 mol of water were added to the obtained chelate compound to obtain a sol of $TiO_2$ particles. Then, the obtained sol was left at rest for two hours under a temperature of 40° C. to perform aging treatment. The manufactured sol is called the $TiO_2$ sol.

Apart from this, sols were manufactured with the additive amount of IPA changed, and the relationship between the additive amount of IPA and the particle diameter of the $TiO_2$ particles was examined. This experiment was performed with the value of the number of moles of IPA/the number of moles of MEK fixed to be about 0.6 and with the additive amount of IPA with respect to 0.01 mol of tetra-i-propoxy titanium changed. Using a laser diffraction/scattering particle diameter/particle size distribution measuring apparatus manufactured by Nikkiso Co., Ltd., the median diameters of the $TiO_2$ particles contained in the sol after aging treatment were measured. The results are shown in FIG. 2.

Figure 2:
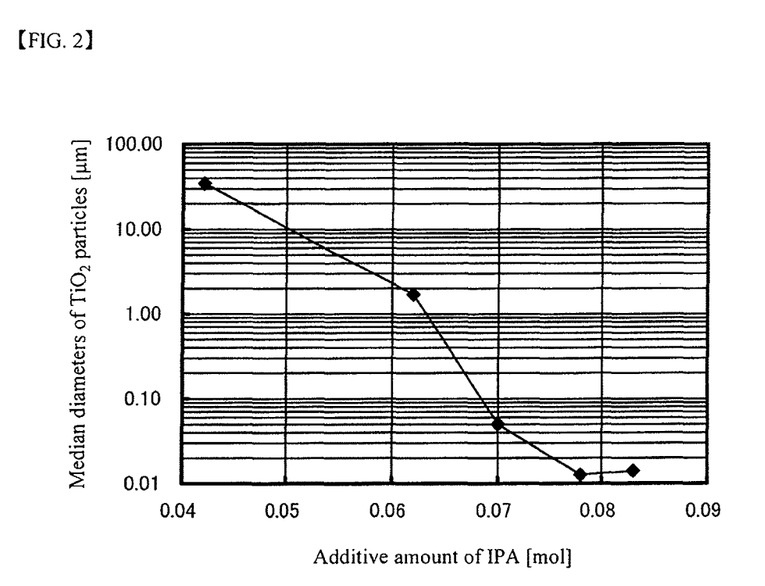
FIG. 2 is a graph illustrating the relationship between the additive amount of IPA and the particle diameter of $TiO_2$ particles.

As shown in FIG. 2, the larger the additive amount of IPA is, the smaller the median diameter of the produced $TiO_2$ particles becomes. It has been confirmed that in order to produce $TiO_2$ particles having a median diameter of 50 nm (0.05 μm) or less, it is necessary to set the additive amount of IPA to 0.07 mol or more (an amount seven times the number of moles of the used organometallic compound or more). The particle diameter of the $TiO_2$ particles in the above $TiO_2$ sol manufactured with 0.083 mol of IPA added was 100 nm or less, and the median diameter thereof was 14 nm.

[$TiO_2/SiO_2$ Sol]

In the above manufacture of $TiO_2$ sol, after 0.005 mol of tetraethoxysilane was added to the chelate compound of tetra-i-propoxy titanium, IPA, MEK, and water were added thereto to obtain a sol of $TiO_2/SiO_2$ complex particles. The obtained sol was left at rest for two hours under a temperature of 40° C. to perform aging treatment. The manufactured sol is called the $TiO_2/SiO_2$ sol.

[$TiO_2/ZrO_2$ Sol]

In the above manufacture of $TiO_2$ sol, after a chelate compound chelated by adding 0.01 mol of acetylacetone to 0.005 mol of zirconium alkoxide was added to the chelate compound of tetra-i-propoxy titanium, IPA, MEK, and water were added thereto to obtain a sol of $TiO_2/ZrO_2$ complex particles. The obtained sol was left at rest for two hours under a temperature of 40° C. to perform aging treatment. The manufactured sol is called the $TiO_2/ZrO_2$ sol.

Manufacture of Dielectric Film

Examples 1 to 3

Carboxy group-modified hydrogenated nitrile rubber ("Therban (trademark) XT8889" manufactured by LANXESS) was dissolved in acetylacetone to prepare a polymer solution with a solid content concentration of 12% by mass. Next, 20.57 parts by mass of the $TiO_2$ sol was mixed into 100 parts by mass of the prepared polymer solution, and in addition, 3 parts by mass of an acetylacetone solution of tetrakis (2-ethylhexyloxy) titanium (a concentration of 20% by mass) as a cross-linking agent was added thereto to prepare a mixed solution. The prepared mixed solution was applied onto a substrate and dried, then, heated at 150° C. for about 60 minutes to obtain a dielectric film. The film thickness of the dielectric film was about 20 μm, and the content of $TiO_2$ particles was 6.6 parts by mass with respect to 100 parts by mass of elastomer (HX—NBR). The manufactured dielectric film was named the dielectric film of Example 1.

Another two types of dielectric films were manufactured in the same manner as Example 1 except that the type and blend amount of the sol were changed. The manufactured dielectric films were named the dielectric film of Example 2 (including the $TiO_2/SiO_2$ sol) and the dielectric film of Example 3 (including the $TiO_2/ZrO_2$ sol).

Comparative Example 1

A dielectric film was manufactured in the same manner as Example 1 except that no sol was blended. The manufactured dielectric film was named the dielectric film of Comparative Example 1.

Examples 4 to 7

Further, a dielectric film was manufactured with silica as an inorganic filler added. First, 100 parts by mass of carboxy group-modified hydrogenated nitrile rubber (the same as the above) and 10 parts by mass of silica ("Aerosil (trademark) 380" manufactured by Nippon Aerosil Co., Ltd.) were mixed and kneaded by a roll mill. Next, the kneaded material was dissolved in acetylacetone to prepare a polymer solution with a solid content concentration of 12% by mass. Then, 18.95 parts by mass of the $TiO_2$ sol was mixed into 100 parts by mass of the prepared polymer solution, and in addition, 3 parts by mass of an acetylacetone solution of tetrakis (2-ethylhexyloxy) titanium (a concentration of 20% by mass) as a cross-liking agent was added thereto to prepare a mixed solution. The prepared mixed solution was applied onto a substrate and dried, then, heated at 150° C. for about 60 minutes to obtain a dielectric film. The film thickness of the dielectric film was about 20 μm, and the content of $TiO_2$ particles was 6.6 parts by mass with respect to 100 parts by mass of elastomer (HX—NBR). The manufactured dielectric film was named the dielectric film of Example 4.

Another three types of dielectric films were manufactured in the same manner as Example 4 except that the type and blend amount of the sol were changed. The manufactured dielectric films were named the dielectric film of Example 5 (including the $TiO_2/SiO_2$ sol), the dielectric film of Example 6 (including the $TiO_2/ZrO_2$ sol), and the dielectric film of Example 7 (including the $TiO_2$ sol and the $TiO_2/ZrO_2$ sol).

Comparative Example 2

A dielectric film was manufactured in the same manner as Example 4 except that no sol was blended. The manufactured dielectric film was named the dielectric film of Comparative Example 2.

<Properties of Dielectric Film>
[Modulus of Elasticity]

The static shear modulus of the manufactured dielectric films was measured in conformity with JIS K 6254 (2003). An elongation ratio in a low-deformation tension test was set to be 25%.

[Volume Resistivity]

The volume resistivity of the manufactured dielectric films was measured in conformity with JIS K 6271 (2008). The measurement was performed with a DC voltage of 100 V applied.

[Evaluation]

The measurement results of the modulus of elasticity and volume resistivity of the dielectric films are shown in Table 1 together with the compositions of the dielectric films. In Table 1, the content of metallic oxide particles is a value converted from the amount of titanium (Ti) in the used sol.

TABLE 1

| Raw material [parts by mass] | | Example 1 | Example 2 | Example 3 | Comparative Example 1 | Example 4 | Example 5 | Example 6 | Example 7 | Comparative Example 2 |
|---|---|---|---|---|---|---|---|---|---|---|
| Rubber polymer | HX-NBR | 100 | 100 | 100 | 100 | 100 | 100 | 100 | 100 | 100 |
| Cross-linking agent | Tetrakis (2-ethylhexyloxy) titanium | 5 | 5 | 5 | 5 | 5 | 5 | 5 | 5 | 5 |
| Inorganic filler | Silica | — | — | — | — | 10 | 10 | 10 | 10 | 10 |
| Metallic oxide particles | $TiO_2$ particles | 6.6 | — | — | — | 6.6 | — | — | 6.6 | — |
| | $TiO_2/SiO_2$ complex particles | — | 9.1 | — | — | — | 9.1 | — | — | — |
| | $TiO_2/ZrO_2$ complex particles | — | — | 11.7 | — | — | — | 9.1 | 5.82 | — |
| Evaluation | Modulus of elasticity [Mpa] | 7.1 | 6.2 | 8.7 | 2.9 | 10.8 | 13.2 | 15.4 | 15.1 | 4.3 |
| | Volume resistivity [Ω · cm] | $4.45 \times 10^{13}$ | $6.54 \times 10^{13}$ | $1.47 \times 10^{14}$ | $1.01 \times 10^{11}$ | $1.40 \times 10^{14}$ | $3.65 \times 10^{14}$ | $1.60 \times 10^{14}$ | $4.30 \times 10^{14}$ | $2.43 \times 10^{12}$ |
| | Dielectric breakdown strength [V/μm] | 100 | 105 | 100 | 50 | 120 | 130 | 120 | 150 | 70 |
| | Leakage current [μA] | 2 | 4 | 3 | 3 | 2 | 8 | 7 | 7 | 2 |

In Table 1, Examples 1 to 3 and Comparative Example 1 that contain no silica as the inorganic filler are compared. The dielectric films of Examples 1 to 3 gave higher moduli of elasticity and higher volume resistivities by two digits as compared to the dielectric film of Comparative Example 1 that contains no metallic oxide particles. In particular, the dielectric film of Example 3 that includes the $TiO_2/ZrO_2$ complex particles gave the highest volume resistivity. Next, Examples 4 to 7 and Comparative Example 2 that contain silica as the inorganic filler are compared. The dielectric films of Examples 4 to 7 gave higher moduli of elasticity and higher volume resistivities by about two digits as compared to the dielectric film of Comparative Example 2 that contains no metallic oxide particles. In particular, the dielectric film of Example 5 that contains the $TiO_2/SiO_2$ complex particles and the dielectric film of Example 7 that contains both the $TiO_2$ particles and the $TiO_2/ZrO_2$ complex particles gave larger volume resistivities.

[Relationship Between Content of $TiO_2$ Particles and Physical Properties]

Figure 3:
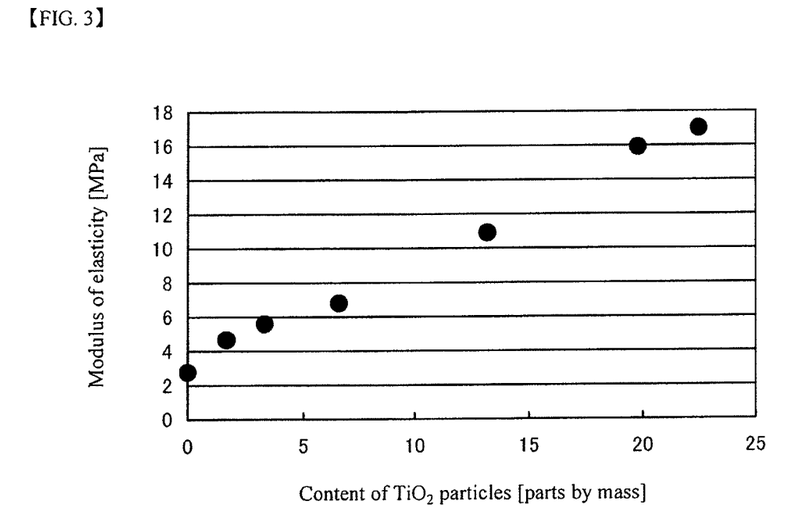
FIG. 3 is a graph illustrating changes in the modulus of elasticity with respect to the content of $TiO_2$ particles.
Figure 4:
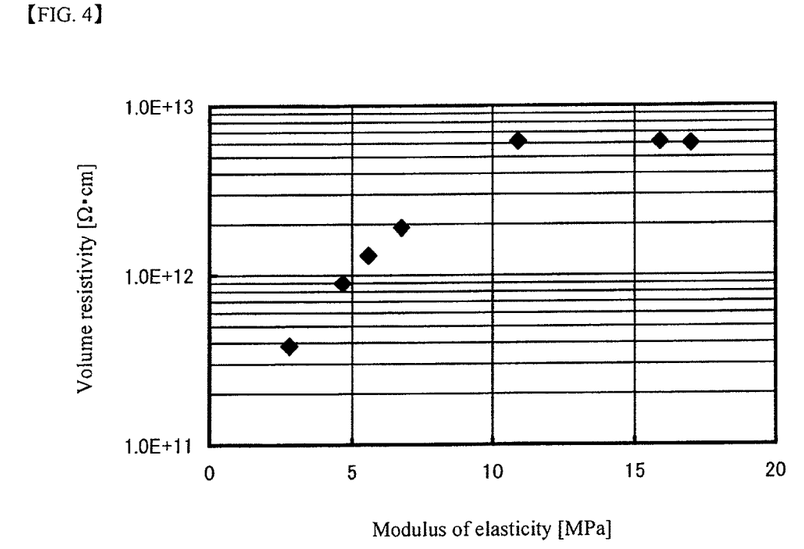
FIG. 4 is a graph illustrating the relationship between the modulus of elasticity and volume resistivity.

By changing the blend amount of the $TiO_2$ sol with respect to 100 parts by mass of the polymer solution, dielectric films having different contents of $TiO_2$ particles were manufactured. Then, the relationship among the content of $TiO_2$ particles, the modulus of elasticity, and the volume resistivity was examined in the dielectric films. FIG. 3 shows changes in the modulus of elasticity with respect to the content of $TiO_2$ particles. FIG. 4 shows the relationship between the modulus of elasticity and the volume resistivity. The content of $TiO_2$ particles is a value converted from an amount of Ti in the $TiO_2$ sol. In FIG. 4, "E+11" on the vertical axis means "$10^{11}$". For example, "1.0E+11" on the vertical axis indicates "$1.0\times10^{11}$."

As shown in FIG. 3, as the content of $TiO_2$ particles increased, the modulus of elasticity of the dielectric film increased. As shown in FIG. 4, even when the modulus of elasticity exceeded 15 MPa, the volume resistivity did not increase very much. From these results, it has been confirmed that when the content of $TiO_2$ particles exceeds 20 parts by mass, only increased modulus of elasticity is given, and the effect of increasing electric resistance is poor.

<Manufacture of Actuator>

Using the manufactured dielectric film, an actuator was manufactured. First, carbon black was mixed into an acrylic rubber polymer solution and dispersed therein to prepare a conductive coating. Then, the conductive coating was screen-printed onto both the front side and the back side of the manufactured dielectric film to provide electrodes. The actuators that have been thus manufactured are called "the actuator of Example 1" or the like corresponding to the type of the dielectric film. The actuators of Examples 1 to 7 are included in the transducer according to the present invention.

<Evaluation of Actuators>

Figure 5:
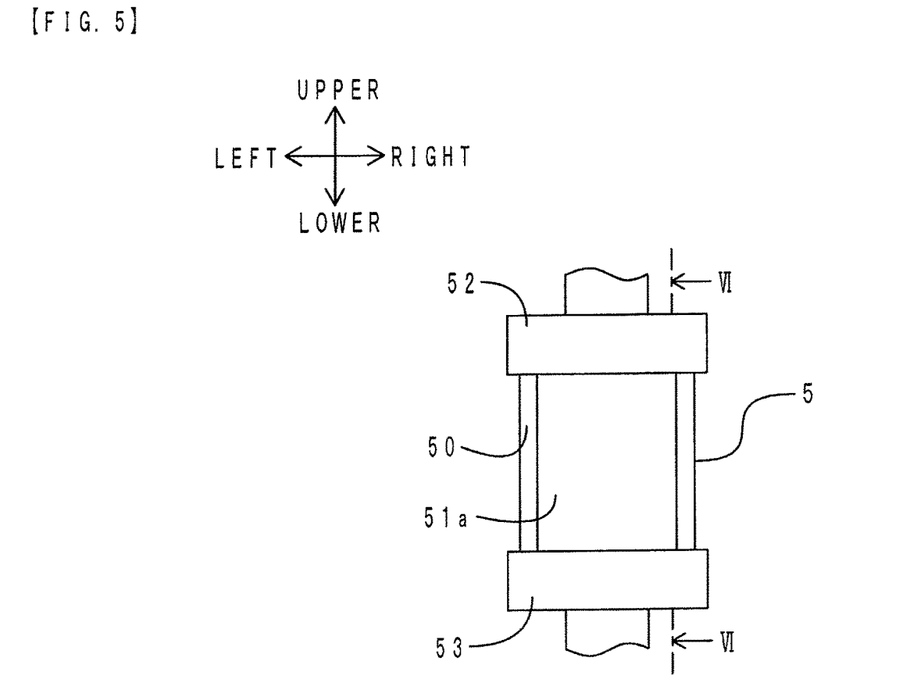
FIG. 5 is a front-side elevation view of an actuator mounted on a measuring apparatus.
Figure 6:
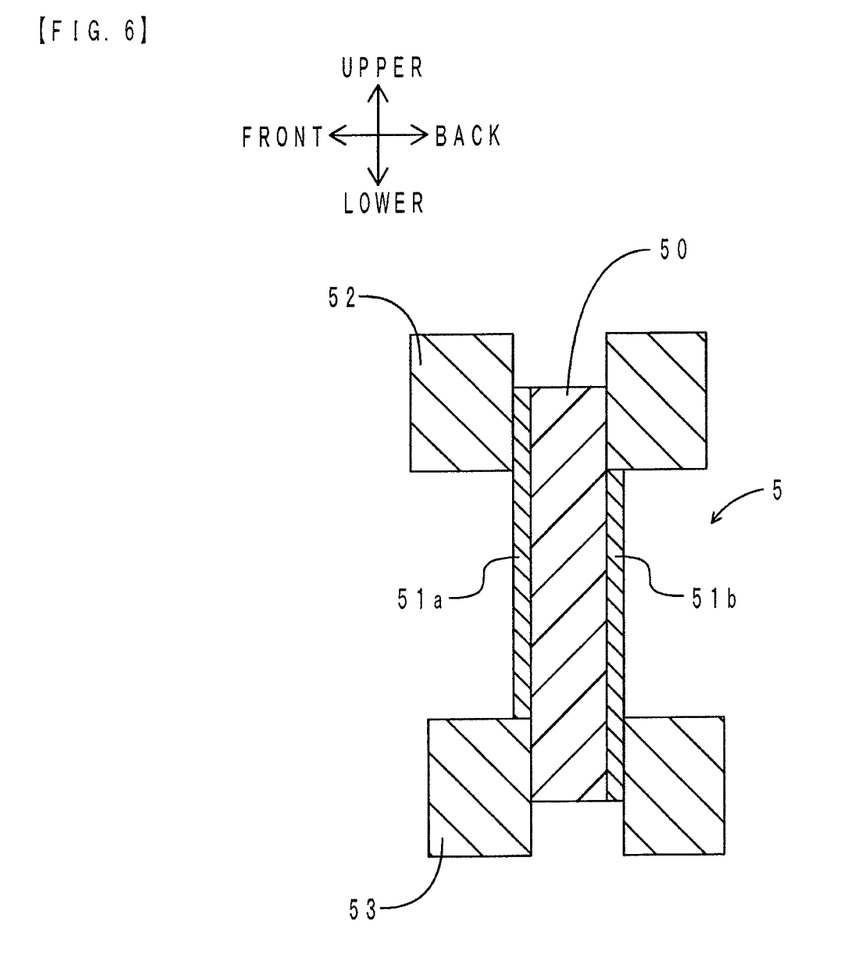
FIG. 6 is a VI-VI sectional view of FIG. 5.

The dielectric breakdown strengths and the leakage current of the manufactured actuators were measured. A measuring apparatus and a measuring method will be described. FIG. 5 illustrates a front-side elevation view of an actuator mounted on the measuring apparatus. FIG. 6 illustrates a VII-VII sectional view of FIG. 5.

As illustrated in FIG. 5 and FIG. 6, the upper end of an actuator 5 is held by an upper chuck 52 of the measuring apparatus. The lower end of the actuator 5 is held by a lower chuck 53. The actuator 5 is arranged between the upper chuck 52 and the lower chuck 53 while being extended in advance in the up and down direction (with an elongation ratio of 25%).

The actuator 5 includes a dielectric film 50 and a pair of electrodes 51a, 51b. The dielectric film 50 is a rectangular thin film of 50 mm long, 25 mm wide, and about 20 urn thick in a natural state. The electrodes 51a, 51b are arranged so as to face each other in the front and back direction across the dielectric film 50. Each of the electrodes 51a, 51b has the shape of a rectangular thin film of 40 mm long, 25 mm wide, and about 10 µm thick in a natural state. The electrodes 51a, 51b are arranged so as to be displaced from each other by 10 mm in the up and down direction. In other words, the electrodes 51a, 51b overlap, via the dielectric film 50, in a range of 30 mm long and 25 mm wide. An electric wire (not shown) is connected to the lower end of the electrode 51a. Similarly, an electric wire (not shown) is connected to the upper end of the electrode 51b. The electrodes 51a, 51b are connected to a power source (not shown) through the respective electric wires.

When a voltage is applied between the electrodes 51a, 51b, an electrostatic attraction occurs between the electrodes 51a, 51b to compress the dielectric film 50. The thickness of the dielectric film 50 thereby decreases, and the dielectric film 50 expands in the extension direction (the up and down direction). The measurement was performed by increasing stepwise the applied voltage until the dielectric film 50 was broken. A value obtained by dividing a voltage value immediately before the dielectric film 50 was broken by the film thickness of the dielectric film 50 was considered as a dielectric breakdown strength. At that time, a current passing through between the electrodes 51a, 51b was measured and was considered as leakage current. Table 1 shows the measurement results of the dielectric breakdown strength and leakage current in the actuators of Examples and Comparative Examples.

In Table 1, Examples 1 to 3 and Comparative Example 1 that contain no silica as the inorganic filler in the dielectric films are compared. The actuators of Examples 1 to 3 gave higher dielectric breakdown strength as compared to the actuator of Comparative Example 1. Next, Examples 4 to 7 and Comparative Example 2 that contain silica as the inorganic filler in the dielectric films are compared. The actuators of Examples 4 to 7 gave higher dielectric breakdown strength as compared to the actuator of Comparative Example 2. In particular, the actuator of Example 7 that includes the dielectric film containing both the $TiO_2$ particles and the $TiO_2/ZrO_2$ complex particles gave the highest dielectric breakdown strength. The actuators of Examples 4 to 7 that include the dielectric films containing silica as the inorganic filler in addition to the metallic oxide particles gave higher dielectric breakdown strength than the actuators of Examples 1 to 3 containing no silica. From the foregoing, it has been confirmed that by using the dielectric film according to the present invention, an actuator having high dielectric breakdown strength can be achieved.

INDUSTRIAL APPLICABILITY

The transducer employing the dielectric film according to the present invention can be widely used for an actuator, a sensor, and the like that perform conversion between mechanical energy and electric energy and a speaker, a microphone, a noise canceller, and the like that perform conversion between acoustic energy and electric energy. In particular, the transducer is suitable as a flexible actuator that is used in: an artificial muscle for use in industrial, medical and welfare robots, power-assisted suits, and the like; a small-sized pump for use in cooling electronic components, for medical use, and the like; and medical instruments, and the like.

What is claimed is:

1. A method for manufacturing a dielectric film, the dielectric film including an elastomer and metallic oxide particles having a particle diameter of 100 nm or less that are chemically bonded to the elastomer and are dispersed in the elastomer in a state of primary particles, the method comprising:
- a chelating process of adding a chelating agent to an organometallic compound to produce a chelate compound of the organometallic compound;
- a sol manufacturing process of adding an organic solvent and water to the chelate compound to obtain a sol of metallic oxide particles having a hydroxy group produced by hydrolytic reaction of the organometallic compound;
- a mixed solution preparing process of mixing the sol of the metallic oxide particles and a polymer solution containing a rubber polymer having a functional group that optionally reacts with a hydroxy group to prepare a mixed solution; and
- a film forming process of applying the mixed solution onto a substrate and curing a resultant coating film to obtain a dielectric film.

2. The method according to claim 1, wherein the functional group of the rubber polymer is one or more groups selected from a carboxy group, an amino group, and an epoxy group.

3. The method according to claim 1, wherein the organic solvent is one or more groups selected from methanol, ethanol, isopropyl alcohol, methyl ethyl ketone, methyl isobutyl ketone and tetrahydrofuran.

4. The method according to claim 1, wherein the organic solvent is both isopropyl alcohol and methyl ethyl ketone.

5. The method according to claim 4, wherein a ratio of the number of moles of isopropyl alcohol (IPA) to the number of moles of methyl ethyl ketone (MEK) (the number of moles of IPA/the number of moles of MEK) is 0.6.

6. The method according to claim 1, wherein, before the mixed solution preparing process, aging treatment or microwave treatment is performed on the sol of metallic oxide particles obtained in the sol manufacturing process.

7. A method for manufacturing a dielectric film, the dielectric film including an elastomer and metallic oxide particles having a particle diameter of 100 nm or less that are chemically bonded to the elastomer and are dispersed in the elastomer in a state of primary particles, the metallic oxide particles containing $TiO_2/ZrO_2$ complex particles or $TiO_2/SiO_2$ complex particles, the method comprising:
- a chelating process of adding a chelating agent to a titanium alkoxide compound to produce a chelate compound of the titanium alkoxide compound;
- a sol manufacturing process of adding any one of a zirconium alkoxide compound, a chelate compound of the zirconium alkoxide compound, and a silicon alkoxide compound, and then an organic solvent and water to the chelate compound of the titanium alkoxide compound to obtain a sol of $TiO_2/ZrO_2$ complex particles or $TiO_2/SiO_2$ complex particles having a hydroxy group produced by hydrolytic reaction of the titanium alkoxide compound and a zirconium alkoxide compound or a silicon alkoxide compound;
- a mixed solution preparing process of preparing a mixed solution containing the sol of the $TiO_2/ZrO_2$ complex particles or the $TiO_2/SiO_2$ complex particles and a polymer solution containing a rubber polymer having a functional group that optionally reacts with a hydroxy group; and
- a film forming process of applying the mixed solution onto a substrate and curing a resultant coating film to obtain a dielectric film.

8. The method according to claim 7, wherein the metallic oxide particles further contains titanium dioxide ($TiO_2$) particles, and the mixed solution prepared in the mixed solution preparing process contains a sol of $TiO_2$ particles having a hydroxy group produced by adding an organic solvent and water to a chelate compound of a titanium alkoxide compound and by hydrolytic reaction of the titanium alkoxide compound.

9. The method according to claim 7, wherein the functional group of the rubber polymer is one or more groups selected from a carboxy group, an amino group, and an epoxy group.

10. The method according to claim 7, wherein the organic solvent is one or more groups selected from methanol, ethanol, isopropyl alcohol, methyl ethyl ketone, methyl isobutyl ketone and tetrahydrofuran.

11. The method according to claim 7, wherein the organic solvent is both isopropyl alcohol and methyl ethyl ketone.

12. The method according to claim 11, wherein a ratio of the number of moles of isopropyl alcohol (IPA) to the number of moles of methyl ethyl ketone (MEK) (the number of moles of IPA/the number of moles of MEK) is 0.6.

13. The method according to claim 7, wherein, before the mixed solution preparing process, aging treatment or microwave treatment is performed on the sol of metallic oxide particles obtained in the sol manufacturing process.

* * * * *